US012666627B2

(12) United States Patent
Vaziri et al.

(10) Patent No.: US 12,666,627 B2
(45) Date of Patent: Jun. 23, 2026

(54) MEMORY DEVICE AND METHOD OF FORMING THE SAME AND INTEGRATED CIRCUIT

(71) Applicant: Taiwan Semiconductor Manufacturing Company, Ltd., Hsinchu (TW)

(72) Inventors: Sam Vaziri, San Jose, CA (US); Isha Datye, Hsinchu (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1084 days.

(21) Appl. No.: 17/738,007

(22) Filed: May 6, 2022

(65) Prior Publication Data

US 2023/0240081 A1     Jul. 27, 2023

Related U.S. Application Data

(60) Provisional application No. 63/302,980, filed on Jan. 25, 2022.

(51) Int. Cl.
H10B 63/00          (2023.01)
H10N 70/00          (2023.01)

(52) U.S. Cl.
CPC ............. H10B 63/24 (2023.02); H10B 63/80 (2023.02); H10N 70/011 (2023.02)

(58) Field of Classification Search
CPC ................................ H10B 63/00; H10N 70/00
See application file for complete search history.

(56) References Cited

U.S. PATENT DOCUMENTS 8,603,888 B2    12/2013  Liu
2019/0221739 A1*  7/2019  Kim ..................... H10N 70/023

FOREIGN PATENT DOCUMENTS

TW          202147569          12/2021

OTHER PUBLICATIONS

"Office Action of Taiwan Counterpart Application", issued on Apr. 25, 2024, p. 1-p. 4.

* cited by examiner

*Primary Examiner* — Marvin Payen
(74) *Attorney, Agent, or Firm* — JCIPRNET

(57)          ABSTRACT

A memory device includes a selector and a memory cell. The selector includes a first electrode layer, a second electrode layer and a selector layer between the first electrode and the second electrode. The selector layer includes a first element selected from a group consisting of silicon (Si), germanium (Ge), tin (Sn) and aluminum (Al), a second element selected from a group consisting of oxygen (O) and nitrogen (N), and a third element selected from a group consisting of tellurium (Te), selenium (Se) and antimony (Sb).

20 Claims, 7 Drawing Sheets

Form a first electrode layer — S502

Form a selector layer over the first electrode layer by co-sputtering at least one of silicon oxide and silicon and at least one of tellurium (Te), selenium (Se) and antimony (Sb) — S504

Form a second electrode layer over the selector layer — S506

Form a data storage layer over the selector layer — S508

MEMORY DEVICE AND METHOD OF FORMING THE SAME AND INTEGRATED CIRCUIT

CROSS-REFERENCE TO RELATED APPLICATION

This application claims the priority benefit of U.S. provisional application Ser. No. 63/302,980, filed on Jan. 25, 2022. The entirety of the above-mentioned patent application is hereby incorporated by reference herein and made a part of this specification.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory are resistive random access memory (RRAM) and phase change memory (PCM). RRAM and PCM have fast read and write times, nondestructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
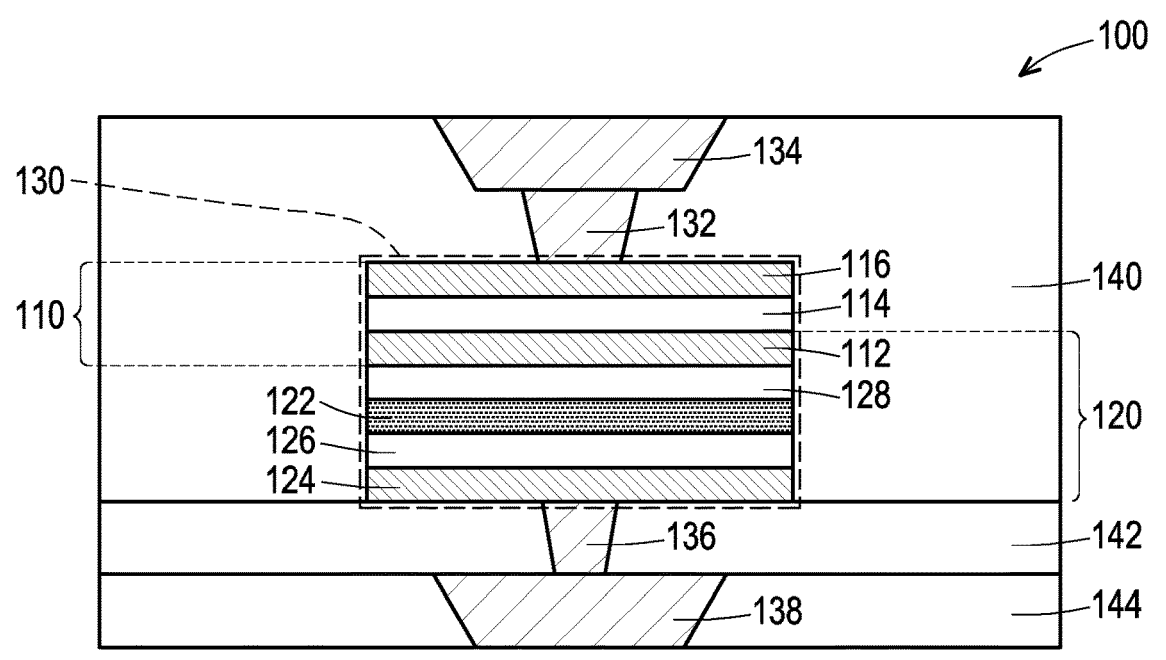
FIG. 1 illustrates a cross-sectional view of a memory device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a memory device in accordance with some embodiments of the disclosure.

Referring to FIG. 1, a memory device 100 includes a memory cell 110 and a selector 120. The selector 120 underlies the memory cell 110, for example. In some embodiments, the memory cell 110 includes an electrode layer 112, a data storage layer 114, and an electrode layer 116. The selector 120 includes a selector layer 122 between an electrode layer 124 and the electrode layer 116. In some embodiments, the selector 120 and the memory cell 110 form a one-selector one-memory cell (1S1MC) stack 130.

In some embodiments, the electrode layer 112 is or includes titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), aluminum (Al), platinum (Pt), carbon (C), or the like. In some embodiments, the electrode layer 116 is or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), aluminum (Al), platinum (Pt), carbon (C), or the like. In some embodiments, the electrode layer 116 and the electrode layer 112 include the same material. In alternative embodiments, the electrode layer 116 and the electrode layer 112 have different materials.

In some embodiments, the memory cell is a resistive switching memory cell. In some embodiments, the memory cell 110 is a RRAM cell and is configured to store data by a resistance of the data storage layer 114. In some embodiments, the data storage layer 114 having a variable resistance is configured to store data states by undergoing reversible changes between a high resistance state associated with a first data state (e.g., a "0") and a low resistance state associated with a second data state (e.g., a "1"). For example, to achieve a low resistance state within the data storage layer 114, a first set of bias conditions may be applied to the electrode layer 112 and the electrode layer 116. The first set of bias conditions drive oxygen from data storage layer 114 to the electrode layer 116, thereby forming conductive filaments of oxygen vacancies across the data storage layer 114. Alternatively, to achieve a high resistance state within the data storage layer 114, a second set of bias conditions may be applied to the electrode layer 112 and the electrode layer 116. The second set of bias conditions break the conductive filaments by driving oxygen from the electrode layer 116 to the data storage layer 114.

In alternative embodiments, the data storage layer 114 is replaced with some other suitable data storage structure, such that the memory cell 110 is another type of memory cell. For example, the data storage layer 114 is replaced with a phase change element (PCE), and the memory cell 110 is a phase change memory (PCM) cell. The PCM cell may include a bottom electrode (e.g., electrode layer 112), a top electrode (e.g., electrode layer 116), a PCE (e.g., data storage layer 114) between the top and bottom electrodes and a heating element. The PCE has a variable phase representing a bit of data. In operation, the heating element heats the PCE to change the PCE between an amorphous phase and a crystalline phase.

The PCE may be or include a chalcogenide material, such as an indium(In)-antimony(Sb)-tellurium(Te) (IST) material or a germanium(Ge)-antimony(Sb)-tellurium(Te) (GST) material. The ISG material may include $In_2Sb_2Te_5$, $In_1Sb_2Te_4$, $In_1Sb_4Te_7$ or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$ or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt. Other resistance variable materials include transition metal oxide materials or alloys including two or more metals, such as transition metals, alkaline earth metals, and/or rare earth metals. Embodiments are not limited to a particular variable resistance material or materials associated with the storage elements of the PCM cell. The heating element may be made of titanium nitride (TiN), titanium carbide (TiC), tungsten nitride (WN), some other high resistance material, Ru, $RuO_x$, or a combination thereof. The heating element may be disposed below or above the top and bottom electrodes. However, the disclosure is not limited thereto. The PCM cell may have other suitable configuration.

In some embodiments, the selector layer 122 includes a volatile switching material, and the volatile switching material includes a first element selected from a group consisting of silicon (Si), germanium (Ge), tin (Sn), aluminum (Al) and the like, a second element selected from a group consisting of oxygen (O), nitrogen (N) and the like, and a third element selected from a group consisting of tellurium (Te), selenium (Se), antimony (Sb) and the like. In some embodiments, an atomic percentage of the first element in the selector layer 122 is in a range of 15% to 40%, an atomic percentage of the second element in the selector layer 122 is in a range of 40% to 70%, and an atomic percentage of the third element in the selector layer 122 is in a range of 10% to 40%. In some embodiments, the selector layer 122 includes or consist of silicon oxide compound, the silicon oxide compound is represented by $Si_xO_yA_z$, where A is at least one of tellurium (Te), selenium (Se), antimony (Sb), x, y and z are atomic percentages, and a total of x, y and z is 100%. In some embodiments, x is 15% to 40%, y is 40% to 70%, and z is 10% to 40%. In an embodiment, the selector layer 122 includes or consist of $Si_xO_yTe_z$. In such embodiments, a ratio of a Si % to (Te:O) % is about 0.3 to 1, and a ratio of Te to O is larger than 0.4. Te:O ratio in general can be 0.2 to 0.7. A threshold voltage of the selector layer 122 is in a range of 0.8 V to 1.5 V, for example. A thickness of the selector layer is in a range of 4 nm to 25 nm, for example. In some embodiments, the volatile switching material of the selector layer is an electrically highly non-linear material, that is, when applying voltage or passing current, at some point the electrical resistance of the material abruptly non-linearly drops for increasing voltage/current, and when the voltage or current is removed (for volatile switches) the resistance goes back to the high resistance state.

The selector layer 122 is configured to switch between a low resistance state and a high resistance state depending on whether a voltage applied across the selector 120 is greater than a threshold voltage. In such embodiments, the selector 120 is a threshold-type selector. For example, the selector 120 may have a high resistance state if a voltage across the selector 120 is less than the threshold voltage, and the selector 120 may have a low resistance state if a voltage across the selector 120 is greater than the threshold voltage. In some embodiments, by controlling the thickness and the atom percentage in the selector layer 122, the selector 120 is first fire free, in other words, the forming threshold voltage is similar to the switching threshold voltage. For example, the selector 120 has a low threshold voltage such as lower than 1.5 voltages and a low off-current.

In some embodiments, the electrode layer 124 is or includes titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), aluminum (Al), platinum (Pt), carbon (C), or the like. The electrode layer 124 and the electrode layer 116 may include the same material. For example, the electrode layer 124, the electrode layer 116 include the same material. In an embodiment, the electrode layer 124, the electrode layer 116 and the electrode layer 112 have the same material. In alternative embodiments, the electrode layer 124 and the electrode layer 116 have different materials. In an embodiment, the electrode layer 124, the electrode layer 116 and the electrode layer 112 have different materials.

Figure 2:
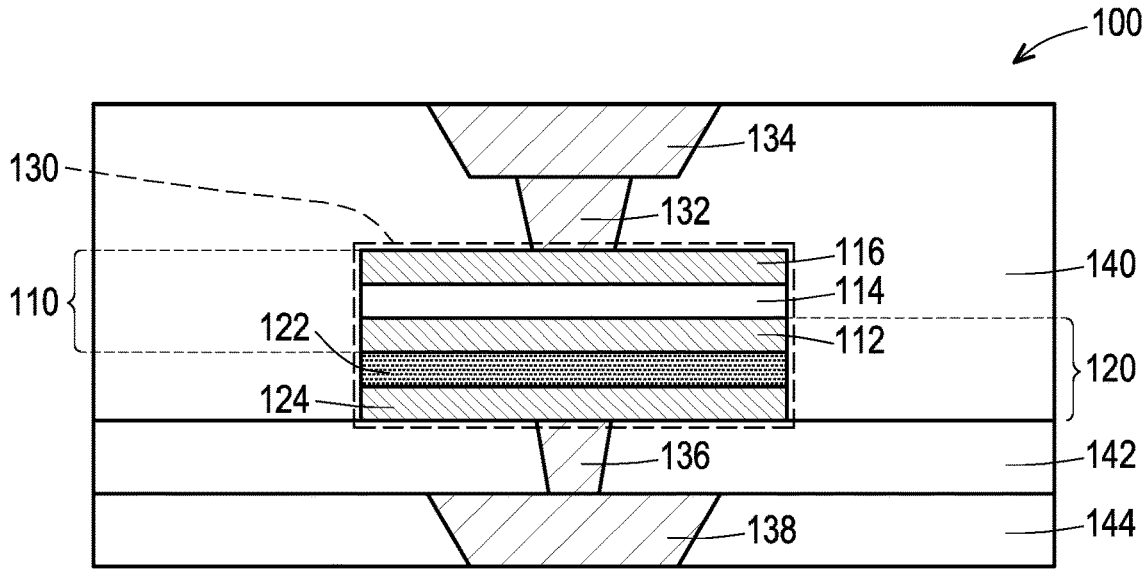
FIG. 2 illustrates a cross-sectional view of a memory device in accordance with some embodiments of the disclosure.
Figure 3:
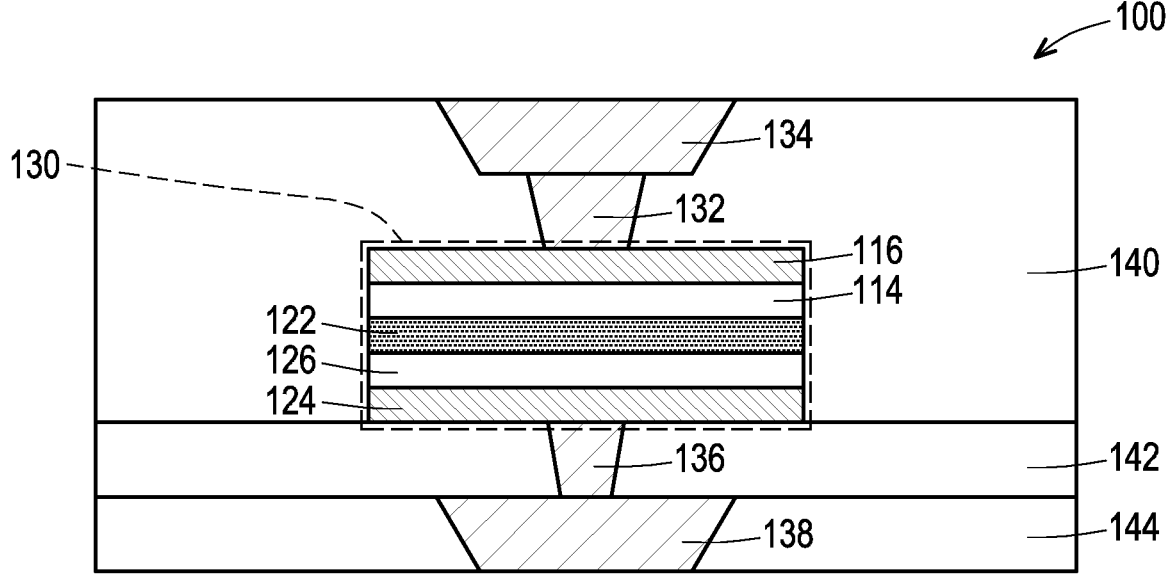
FIG. 3 illustrates a cross-sectional view of a memory device in accordance with some embodiments of the disclosure.

In some embodiments, the selector 120 further includes an interfacial layer 126 between the selector layer 122 and the electrode layer 124 and an interfacial layer 128 between the selector layer 122 and the electrode layer 112. In some embodiments, the interfacial layer 126 and the interfacial layer 128 include a carbon-containing layer and have a thickness in a range of 0.5 nm to 3 nm. For example, the interfacial layer 126 and the interfacial layer 128 include Si, Ge, C or a combination of the foregoing. In some embodiments, the interfacial layer 128 includes a carbon-doped silicon in which silicon content is less than 5%. However, the disclosure is not limited thereto. In alternative embodiments, at least one of the interfacial layer 126 and the interfacial layer 128 is omitted, and thus the selector layer 122 is in direct contact with the electrode layer 116 and/or the electrode layer 124. For example, as shown in FIG. 2, the interfacial layer 126 and the interfacial layer 128 are both omitted, the selector layer 122 is in direct contact with the electrode layer 116 and the electrode layer 124. In alternative embodiments, as shown in FIG. 3, layer(s) (such as the electrode layer 112 and the interfacial layer 128) between the data storage layer 114 of the memory cell 110 and the selector layer 122 is omitted, and thus the selector layer 122 is in direct contact with the data storage layer 114.

In some embodiments, an electrode via 132 overlies the electrode layer 116. A conductive line 134 is electrically coupled to the electrode layer 116 and overlies the electrode via 132. The conductive line 134 may be electrically coupled to overlying conductive lines (e.g., metal wires). In some embodiments, an electrode via 136 underlies the electrode layer 124, and a conductive line 138 is electrically coupled to the electrode layer 124 and underlies the electrode via 136. The conductive line 138 may be electrically coupled to underlying conductive lines (e.g., metal wires). In some embodiments, an IMD layer 140 is disposed around the memory cell 110, the selector 120, the electrode via 132, and the conductive line 134. An IMD layer 142 may be disposed around the conductive via 136 and underlies the IMD layer 140, and an IMD layer 144 may be disposed around the conductive line 138 and underlies the IMD layer 142. However, the disclosure is not limited thereto.

In some embodiments, a width of the electrode layer 116, the data storage layer 114, the electrode layer 112, the interfacial layer 128, the selector layer 122, the interfacial layer 126 and the electrode layer 124 is substantially the same. In other words, sidewalls of the electrode layer 116, the data storage layer 114, the electrode layer 112, the interfacial layer 128, the selector layer 122, the interfacial layer 126 and the electrode layer 124 are substantially flush with one another. However, the disclosure is not limited thereto. In alternative embodiments, the width of the electrode layer 116, the data storage layer 114, the electrode layer 112, the interfacial layer 128, the selector layer 122, the interfacial layer 126 and the electrode layer 124 may be different.

In some embodiments, the selector layer 122 includes silicon oxide compound (e.g., $Si_xO_yTe_zSe_mSb_n$). By controlling the thickness and the atom percentage of the silicon oxide compound, the selector 120 is first fire free and has low threshold voltage and low off-current. In addition, the material of the selector 120 is stable, and the fabrication thereof may be integrated with the existing semiconductor manufacturing process. Accordingly, the memory device including the selector has an improved performance.

Figure 4:
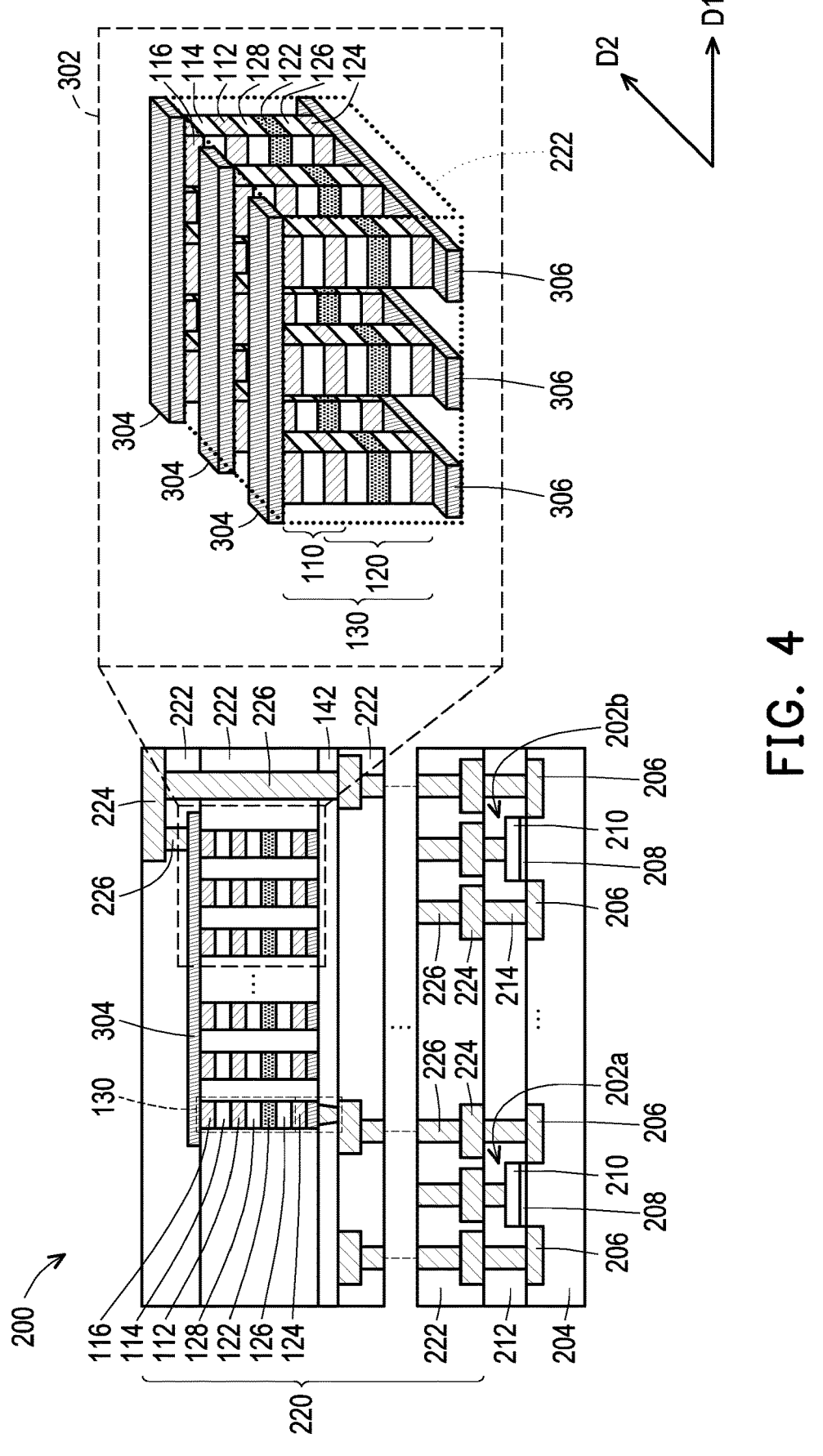
FIG. 4 illustrates a cross-sectional view of an integrated circuit (IC) including a memory device in accordance with some embodiments of the disclosure.

FIG. 4 illustrates a cross-sectional view of an integrated circuit (IC) including a memory device in accordance with some embodiments of the disclosure.

In some embodiments, an IC 200 includes a plurality of first and second active devices 202a and 202b disposed on a semiconductor substrate 204. The first and second active devices 202a and 202b may be metal-oxide-semiconductor filed-effect transistors (MOSFETs). The first and second active devices 202a and 202b respectively include a pair of source/drain regions 206 disposed in the semiconductor substrate 204 and laterally spaced apart, for example. A gate dielectric 208 may be disposed over the semiconductor substrate 204 between the individual source/drain regions 206, and a gate electrode 210 may be disposed over the gate dielectric 208.

In some embodiments, an interlayer dielectric (ILD) layer 212 is disposed over the first and second active devices 202a and 202b and the semiconductor substrate 204. The ILD layer 212 includes one or more ILD materials, for example. In some embodiments, the ILD layer 212 includes one or more of a low-k dielectric layer (e.g., a dielectric with a dielectric constant less than about 3.9), an ultra-low-k dielectric layer, or an oxide (e.g., silicon oxide). Conductive contacts 214 are arranged within the ILD layer 212, for example. The conductive contacts 214 may extend through the ILD layer 212 to the gate electrode 210 and the pair of source/drain regions 206. In some embodiments, the conductive contacts 214 include copper, tungsten, or some other conductive material.

In some embodiments, an interconnect structure 220 is disposed over the ILD layer 212. The interconnect structure 220 includes a plurality of inter-metal dielectric (IMD) layers 222 and a plurality of conductive wires 224 and a plurality of conductive vias 226 disposed within the IMD layers 222, for example. The conductive wires 224 and conductive vias 226 may be configured to provide electrical connections between various devices disposed throughout the IC 200. In some embodiments, the IMD layers 222 each include a low-k dielectric layer, an ultra-low-k dielectric layer, or an oxide. In some embodiments, the conductive wires 224 and conductive vias 226 include copper, aluminum, or some other conductive material.

In some embodiments, a memory device 302 is disposed within the interconnect structure 220. In some embodiments, the memory device 302 is disposed within one of the IMD layers 222. In alternative embodiments, the memory device 302 is disposed within multiple IMD layers 222. In such embodiments, the memory device 302 include multiple layers each including a plurality of 1S1MC stacks 130.

The memory device 302 includes a plurality of first conductive lines 304 (e.g., bit lines), for example. The first conductive lines 304 may each extend laterally in a first direction D1. In some embodiments, the first conductive lines 304 are arranged in parallel with one another. In some embodiments, the plurality of first conductive lines 304 include copper, aluminum, tungsten, some other suitable conductor, or a combination of the foregoing.

A plurality of second conductive lines 306 (e.g., word lines) are arranged under the plurality of first conductive lines 304, for example. The second conductive lines 306 may each extend laterally in a second direction D2 transverse the first direction D1. The second direction D2 is orthogonal to the first direction D1, for example. In some embodiments, the second conductive lines 306 are arranged in parallel with one another. In some embodiments, the plurality of second conductive lines 306 include copper, aluminum, tungsten, some other suitable conductor, or a combination of the foregoing. In alternative embodiments, the electrode layer 116 and/or the electrode layer 124 are omitted, such that the data storage layer 114 directly contacts the first conductive line 304 and/or the selector layer 122 directly contacts the second conductive line 306.

A plurality of 1S1MC stacks 130 are disposed between the plurality of first conductive lines 304 and the plurality of second conductive lines 306, for example. In some embodiments, the 1S1MC stacks 130 are arranged in an array having a plurality of rows and a plurality of columns. In some embodiments, an individual conductive line in the first conductive lines 304 and an individual conductive line in the plurality of second conductive lines 306 are coupled to each individual 1S1MC stack 130.

Each 1S1MC stack 130 includes a memory cell 110 overlying a selector 120, for example. The selector 120 includes a selector layer 122 disposed between the electrode layer 124 and the electrode layer 112. The memory cell 110 includes a data storage layer 114 disposed between the electrode layer 112 and the electrode layer 116. The selector layer 122 is configured to switch between low resistance states and high resistance states depending on whether a voltage applied across the selector 120 exceeds a threshold voltage. The first conductive lines 304 may each extend along corresponding columns of the array in the first direction D1 and are electrically coupled with the memory cells 110 of the array in the corresponding columns. The second conductive lines 306 may each extend along corresponding rows of the array in the second direction D2 and are electrically coupled with the memory cells 110 of the array in the corresponding rows.

In some embodiments, there are N (N is a whole number 1 or greater) first conductive lines 304 and there are N second active devices 202b. Each of the first conductive lines 304 are electrically coupled to an individual second active device 202b (e.g., to a source/drain region 206 of each second active device 202b) via conductive wires 224 and conductive vias 226, for example. In some embodiments, there are M (M is a whole number 1 or greater) second conductive lines 306 and there are M first active device 202a. Each of the second conductive lines 306 are electrically coupled to an individual first active device 202a (e.g., to a source/drain region 206 of each active device 202a) via conductive wires 224 and conductive vias 226 that are disposed beneath the memory device 302, for example.

FIG. 5A to FIG. 5F illustrate cross-sectional views of a method of forming a memory device including a selector in accordance with some embodiments of the disclosure. Although the cross-sectional views shown in FIG. 5A to FIG. 5F are described with reference to a method, it will be appreciated that the structures shown in FIG. 5A to FIG. 5F are not limited to the method but rather may stand alone separate of the method. Although FIG. 5A to FIG. 5F are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5A:
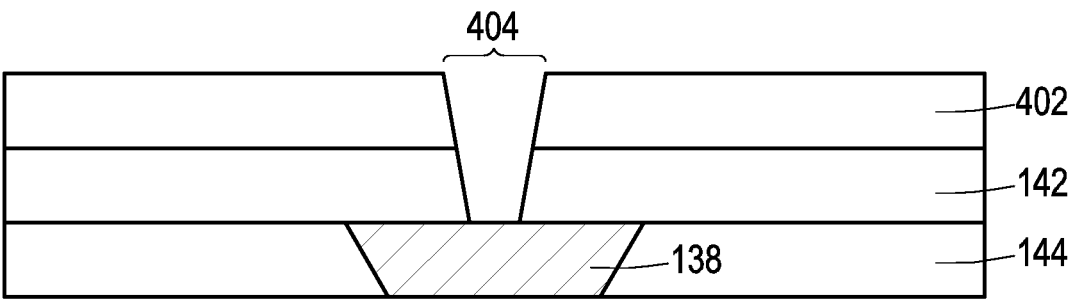
FIG. 5A to FIG. 5F illustrate cross-sectional views of a method of forming a memory device including a selector in accordance with some embodiments of the disclosure.

Referring to FIG. 5A, a conductive line 138 is formed within an IMD layer 144. In some embodiments, an IMD layer 142 is formed over the conductive line 138 and the IMD layer 144. A masking layer 402 is formed over the IMD layer 142, for example. The masking layer 402 may include sidewalls defining an opening 404. The opening 404 is directly above the IMD layer 142 and the conductive line 138, for example. In some embodiments, the opening 404 is centered above the conductive line 138. In some embodiments, the above layers are formed using a deposition process such as chemical vapor deposition (CVD), physical vapor deposition (PVD), some other suitable deposition process(es), or a combination of the foregoing.

In some embodiments, an etching process is performed to etch a portion of the IMD layer 142 directly below the opening 404 within the masking layer 402. The etching process is performed by exposing the portion of the IMD layer 142 directly below the opening 404 to an etchant (not shown), for example. In some embodiments, the etching process is performed by a photolithography/etching process and/or some other suitable patterning process(es). Then, the masking layer 402 is removed.

Figure 5B:
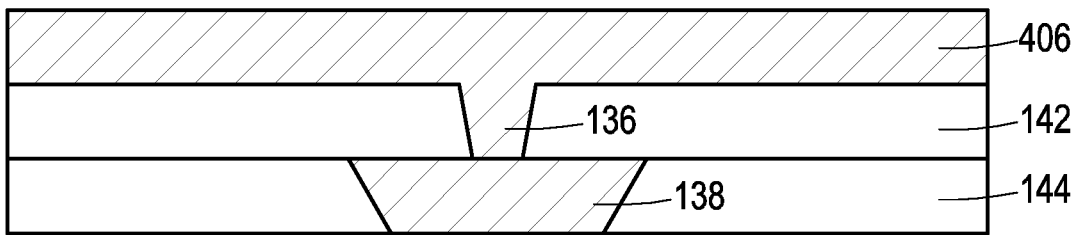

Referring to FIG. 5B, a conductive layer 406 is formed to cover the IMD layer 142 and fill the opening 404 in the IMD layer 142. The depositing may be performed by CVD, PVD, electroless plating, electroplating, some other suitable deposition process(es), or a combination of the foregoing.

Figure 5C:
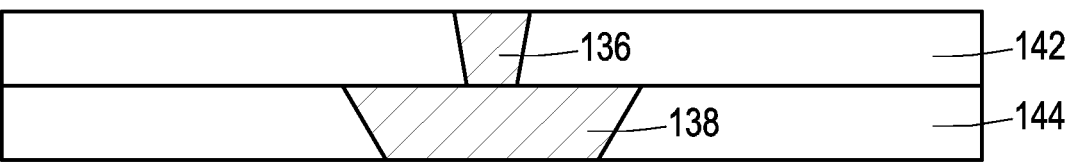

Referring to FIG. 5C, a planarization process is performed on the conductive layer 406, so as to define an electrode via 136 within the IMD layer 142. The planarization may be performed by a CMP and/or some other suitable planarization process(es). In some embodiments, the electrode via 136 is also referred to as a bottom electrode via.

Figure 5D:
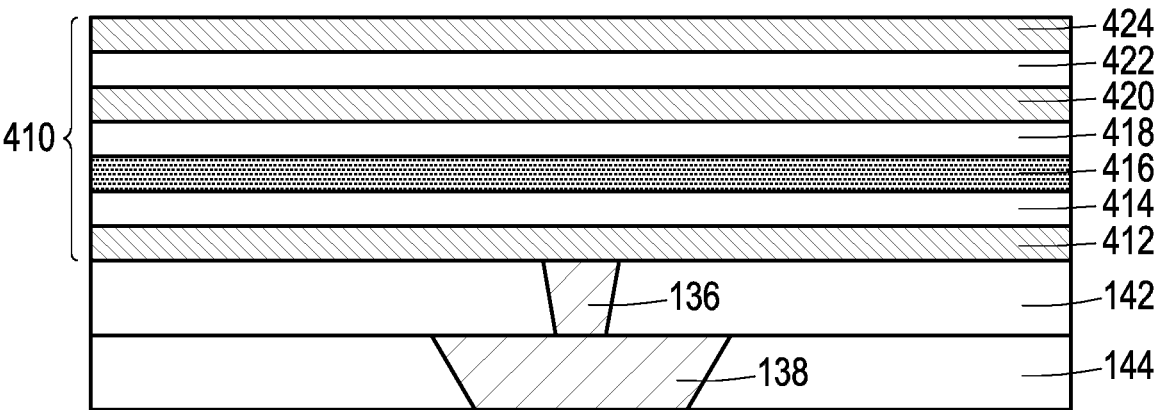

Referring to FIG. 5D, a stack 410 is formed over the IMD layer 142 and the electrode via 136. The stack 410 includes a conductive material layer 412 overlying the IMD layer 142, an interfacial material layer 414 overlying the conductive material layer 412, a selector material layer 416 overlying the interfacial material layer 414, an interfacial material layer 418 overlying the selector material layer 416, a conductive material layer 420 overlying the interfacial material layer 418, a data storage material layer 422 overlying the conductive material layer 420, and a conductive material layer 424 overlying the data storage material layer 422. In some embodiments, the above layers are formed using a deposition process such as CVD, PVD, some other suitable deposition process(es), or a combination of the foregoing.

The selector material layer 416 includes a first element selected from a group consisting of silicon (Si), germanium (Ge), tin (Sn) and aluminum (Al), a second element selected from a group consisting of oxygen (O) and nitrogen (N), and a third element selected from a group consisting of tellurium (Te), selenium (Se) and antimony (Sb). In some embodiments, the selector material layer 416 is formed by a PVD process or a CVD process. In an embodiment, the selector material layer 416 is formed by a sputtering process, a co-sputtering process, a pulsed laser deposition (PLD) process, or an atomic layer deposition (ALD) process. For example, the selector material layer 416 is formed by co-sputtering the first element, the second element and the third element. This co-sputtering process includes applying a first bias to sputter the first element from a first target, applying a second bias to sputter the second element from a second target, and applying a third bias to sputter the third element from a third target, thereby forming the selector material layer 416 over the conductive material layer 412. In alternative embodiments, the selector material layer 416 is formed by co-sputtering the third element and a compound comprising the first element and the second element. For example, the compound is silicon oxide ($SiO_x$, where x is larger than 0, such as 2). Optionally, a gas containing the second element may be introduced during or after co-sputtering at least two of the first to third elements, or the formed layer may be exposed under an atmosphere containing the second element during or after co-sputtering at least two of the first to third elements. The gas containing the second element may be oxygen containing gas or nitrogen containing gas, and the atmosphere containing the second element may be oxygen containing atmosphere or nitrogen containing atmosphere.

In alternative embodiments, the selector material layer 416 is formed by co-sputtering the first element and the third element, and introducing the gas containing the second element or exposing under the atmosphere containing the second element. The gas containing the second element may be oxygen containing gas or nitrogen containing gas, and the atmosphere containing the second element may be oxygen containing atmosphere or nitrogen containing atmosphere. The step of introducing the gas containing the second element or the step of exposing under the atmosphere containing the second element may be performed simultaneously with or after co-sputtering the first element and the third element. For example, the selector material layer 416 is formed by co-sputtering Si and at least one of Te, Se and Sb and simultaneously introducing oxygen-containing gas as a reactive gas, or the selector material layer 416 is formed by co-sputtering Si and at least one of Te, Se and Sb under an atmosphere containing oxygen.

In an embodiment, the selector material layer 416 is formed by depositing an initial layer through co-sputtering Si and at least one of Te, Se and Sb and then exposing the initial layer to an oxygen-containing atmosphere. In some embodiments, the exposure to the oxygen-containing atmosphere is performed before the deposition of the interfacial material layer 418 or before the deposition of the conductive material layer 420 if the interfacial material layer 418 is omitted. In an embodiment in which the interfacial material layer 418 and the conductive material layer 420 are both omitted, the selector material layer 416 is exposed before the deposition of the data storage material layer 422.

In an embodiment, the formed selector material layer 416 containing oxygen may be further exposed to the oxygen-containing atmosphere. As mentioned above, silicon (Si) may be replaced with germanium (Ge), tin (Sn), aluminum (Al) or the like, and oxygen (O) may be replaced with nitrogen (N) or the like. For example, the oxygen-containing gas is replaced with nitrogen-containing gas, and the oxygen-containing atmosphere is replaced with nitrogen-containing atmosphere.

Figure 5E:
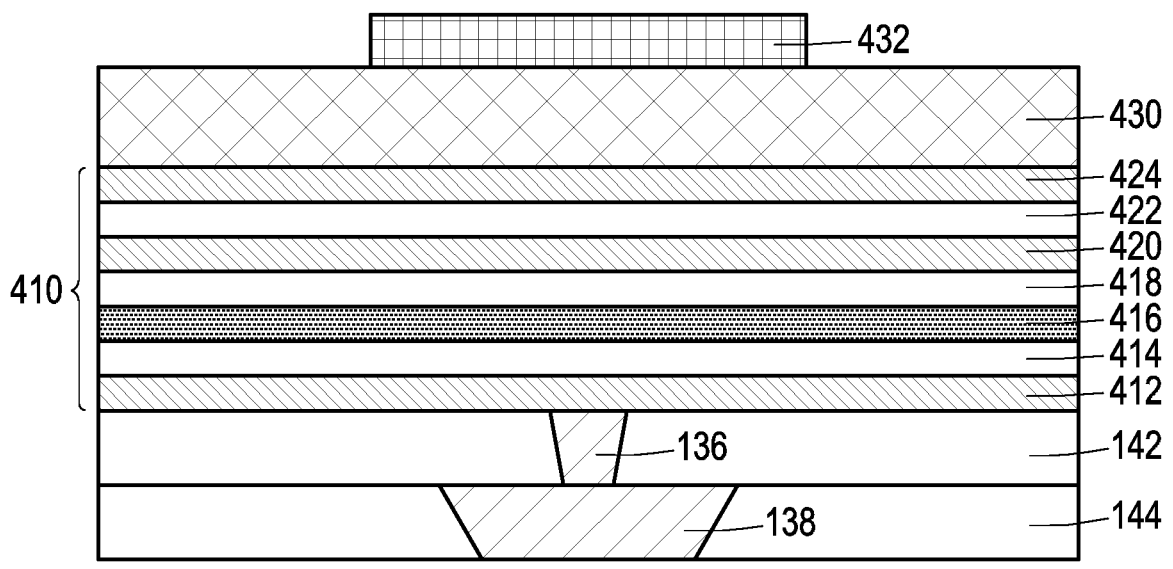

Referring to FIG. 5E, a hard mask layer 430 is formed over the conductive material layer 424. A photomask 432 is formed over the hard mask layer 430, for example. In some embodiments, the photomask 432 covers a memory region of the hard mask layer 430 and leaves outer regions exposed. In some embodiments, the hard mask layer 430 is formed by a deposition process such as CVD, PVD, some other suitable deposition process(es), or a combination of the foregoing. The photomask 432 may be formed by a deposition process such as CVD, PVD, some other suitable deposition process(es), or a combination of the foregoing.

Figure 5F:
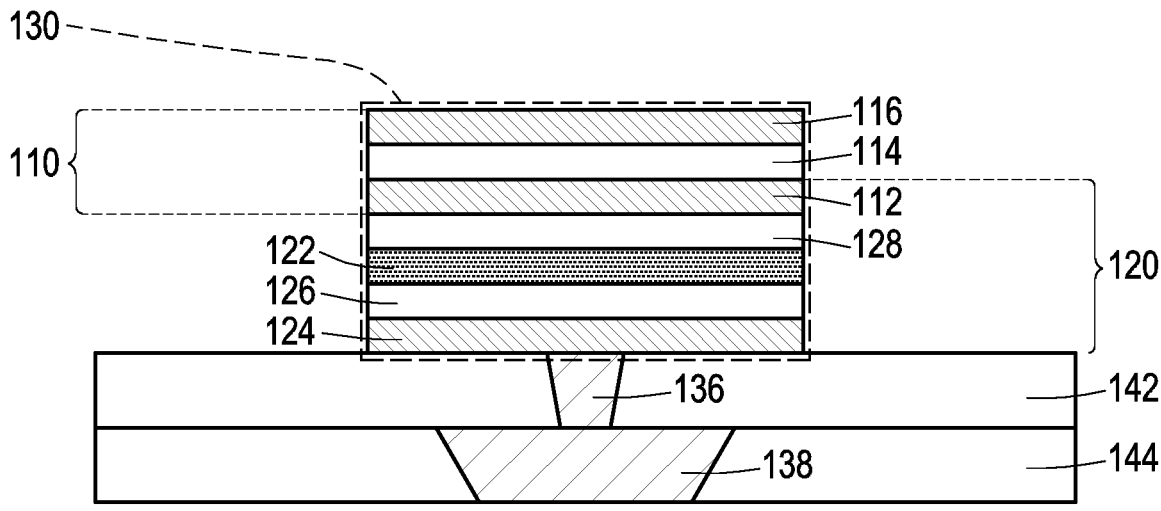

Referring to FIG. 5F, a portion of the stack 410 is removed, so as to define a stack 130 of a memory cell 110 and a selector 120. In some embodiments, an etching process is performed to partially remove the stack 410. In some embodiments, the memory cell 110 includes a data storage layer 114 between an electrode layer 116 and an electrode layer 112 and the selector 120 includes a selector layer 122 between the electrode layer 112 and an electrode layer 124. In some embodiments, the selector 120 further include an interfacial layer 126 between the selector layer 122 and the electrode layer 124 and an interfacial layer 128 between the selector layer 122 and the electrode layer 112. In some embodiments, the memory cell 110 is electrically connected to the selector 120. In some embodiments, the etching process is carried out by exposing the hard mask layer 430 and the stack 410 to an etchant (not shown). In some embodiments, after performing the etching process, an etching process or some other suitable process is performed to remove any remaining portion(s) of the hard mask layer 430 and the photomask 432.

Then, as shown in FIG. 1, an IMD layer 140 is formed over the stack 130 of the memory cell 110 and the selector 120. In some embodiments, the IMD layer 140 directly contacts sidewalls of the stack 130. Then, a conductive via 132 is formed over and directly contacts the second electrode 114, and a conductive line 134 is formed over and directly contacts the conductive via 132, for example. The IMD layer 140 may be formed by CVD, PVD, some other suitable deposition process(es), or a combination of the foregoing. The conductive via 132 and conductive line 134 may be formed by patterning the IMD layer 140 to form via openings with a pattern of the conductive via 132 and/or conductive line 134, depositing a conductive layer filling the via openings and covering the IMD layer 140, and performing a planarization into the conductive layer until the IMD layer 140 is reached. The patterning may be performed by a photolithography/etching process and/or some other suitable patterning process(es). The depositing may be performed by CVD, PVD, electroless plating, electroplating, some other suitable deposition process(es), or a combination of the foregoing. The planarization may be performed by a CMP and/or some other suitable planarization process(es).

Figure 6:
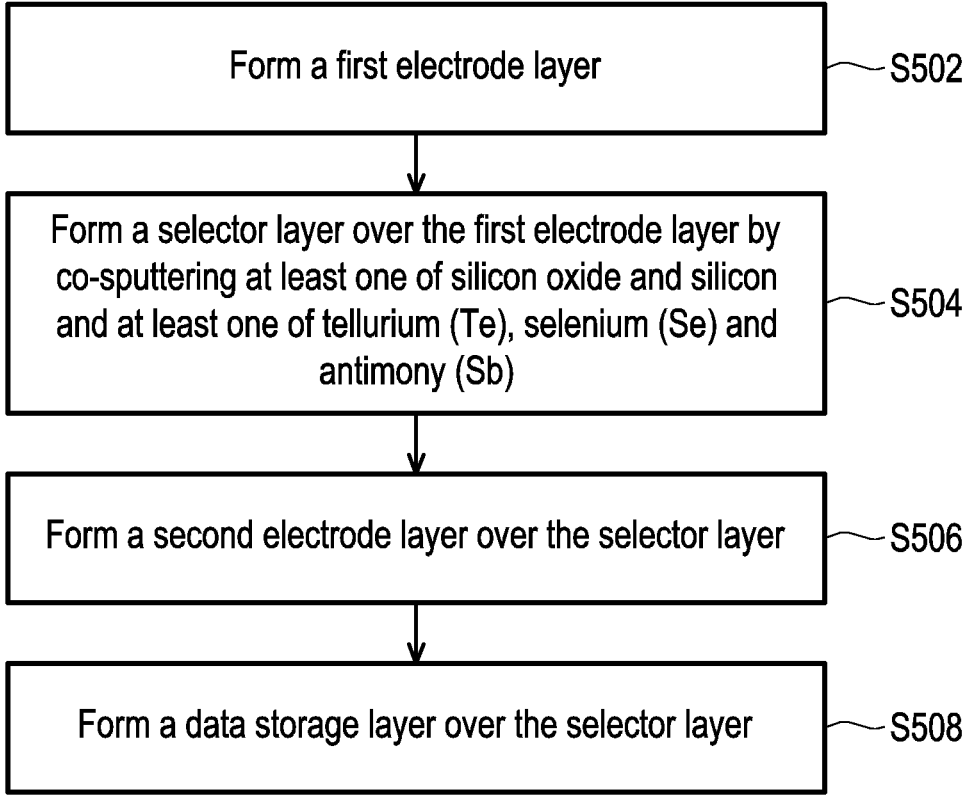
FIG. 6 illustrates a flowchart of a method of forming a memory device in accordance with some embodiments.

FIG. 6 illustrates a flowchart of a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S502, a first electrode layer is formed. FIG. 1 to FIG. 3 and FIG. 5D to FIG. 5F illustrate a view corresponding to some embodiments of act S602.

At act S504, a selector layer is formed over the first electrode layer by co-sputtering at least one of silicon oxide and silicon and at least one of tellurium (Te), selenium (Se) and antimony (Sb). FIG. 1 to FIG. 3 and FIG. 5D to FIG. 5F illustrate a view corresponding to some embodiments of act S604.

At act S506, a second electrode layer is formed over the selector layer. FIG. 1 to FIG. 3 and FIG. 5D to FIG. 5F illustrate a view corresponding to some embodiments of act S606.

At act S508, a data storage layer is formed over the selector layer. FIG. 1 to FIG. 3 and FIG. 5D to FIG. 5F illustrate a view corresponding to some embodiments of act S608.

According to some embodiments, a memory device includes a selector and a memory cell. The selector includes a first electrode layer, a second electrode layer and a selector layer between the first electrode and the second electrode. The selector layer includes a first element selected from a group consisting of silicon (Si), germanium (Ge), tin (Sn) and aluminum (Al), a second element selected from a group consisting of oxygen (O) and nitrogen (N), and a third element selected from a group consisting of tellurium (Te), selenium (Se) and antimony (Sb).

According to some embodiments, an integrated circuit includes a substrate, an array, a plurality of bit lines and a plurality of word lines. The array overlies the substrate and includes multiple stacks in a plurality of rows and a plurality of columns, each of the stacks includes a memory cell and a selector, and a selector layer of the selector includes a first element selected from a group consisting of silicon (Si), germanium (Ge), tin (Sn) and aluminum (Al), a second element selected from a group consisting of oxygen (O) and nitrogen (N), and a third element selected from a group consisting of tellurium (Te), selenium (Se) and antimony (Sb). The bit lines extend along corresponding columns of the array in a first direction, and the bit lines overlie the stacks and are electrically coupled with memory cells of the array in the corresponding columns. The word lines extend along corresponding rows of the array in a second direction transverse the first direction, and the word lines underlie the stacks and are electrically coupled with memory cells of the array in the corresponding rows.

According to some embodiments, a method of forming a memory device includes following steps. A first electrode layer is formed. A selector layer is formed over the first electrode layer, wherein the selector layer includes a first element selected from a group consisting of silicon (Si), germanium (Ge), tin (Sn) and aluminum (Al), a second element selected from a group consisting of oxygen (O) and nitrogen (N), and a third element selected from a group consisting of tellurium (Te), selenium (Se) and antimony (Sb). A second electrode layer is formed over the selector layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a selector, comprising a first electrode layer, a second electrode layer and a selector layer between the first electrode and the second electrode, wherein the selector layer comprises a first element selected from a group consisting of silicon (Si), germanium (Ge), tin (Sn) and aluminum (Al), a second element selected from a group consisting of oxygen (O) and nitrogen (N), and a third element selected from a group consisting of tellurium (Te), selenium (Se) and antimony (Sb), wherein a thickness of the selector layer is in a range of 2 nm to 25 nm; and
a memory cell, comprising a data storage layer over the selector layer.

2. The memory device of claim 1, wherein an atomic percentage of the first element in the selector layer is in a range of 15% to 40%, an atomic percentage of the second element in the selector layer is in a range of 40% to 70%, and an atomic percentage of the third element in the selector layer is in a range of 10% to 40%.

3. The memory device of claim 1, wherein a threshold voltage of the selector layer is in a range of 0.8 V to 1.5 V.

4. The memory device of claim 1, wherein the selector layer is in direct contact with the data storage layer.

5. The memory device of claim 1 further comprising a first interfacial layer between the selector layer and the first electrode layer.

6. The memory device of claim 5 further comprising a second interfacial layer between the selector layer and the second electrode layer.

7. The memory device of claim 1, wherein the memory cell comprises a RRAM cell or a PCRAM cell.

8. An integrated circuit, comprising:
a substrate;
an array overlying the substrate and comprising multiple stacks in a plurality of rows and a plurality of columns, each of the stacks comprising a memory cell and a selector, wherein a selector layer of the selector comprises a first element selected from a group consisting of silicon (Si), germanium (Ge), tin (Sn) and aluminum (Al), a second element selected from a group consisting of oxygen (O) and nitrogen (N), and a third element being selenium (Se);
a plurality of bit lines, extending along corresponding columns of the array in a first direction, wherein the bit lines overlie the stacks and are electrically coupled with memory cells of the array in the corresponding columns; and
a plurality of word lines, extending along corresponding rows of the array in a second direction transverse the first direction, wherein the word lines underlie the stacks and are electrically coupled with memory cells of the array in the corresponding rows.

9. The integrated circuit of claim 8, further comprising an interconnect structure overlying the substrate, wherein the interconnect structure includes a plurality of conductive wires and a plurality of conductive vias disposed within a dielectric layer.

10. The integrated circuit of claim 8, wherein the memory cell is a resistive switching memory cell.

11. The integrated circuit of claim 8, wherein the memory cell is disposed over the selector.

12. The integrated circuit of claim 8, wherein a first electrode layer of the memory cell is in direct contact with the corresponding bit line, and a second electrode layer of the selector is direct contact with the corresponding word line.

13. A method of forming a memory device, comprising:
forming a first electrode layer;
forming a selector layer over the first electrode layer, wherein the selector layer comprises a first element selected from a group consisting of silicon (Si), germanium (Ge), tin (Sn) and aluminum (Al), a second element selected from a group consisting of oxygen (O) and nitrogen (N), and a third element being selenium (Se) ; and
forming a second electrode layer over the selector layer.

14. The method of claim 13, wherein forming the selector layer comprises co-sputtering the first element, the second element and the third element.

15. The method of claim 13, wherein forming the selector layer comprises:
co-sputtering the first element and the third element; and
introducing a gas containing the second element.

16. The method of claim 15, wherein introducing the gas containing the second element is performed simultaneously with or after co-sputtering the first element and the third element.

17. The method of claim 13, wherein forming the selector layer comprises co-sputtering the third element and a compound comprising the first element and the second element.

18. The method of claim 17, wherein the compound is silicon oxide.

19. The memory device of claim 1, wherein the third element is selenium (Se).

20. The method of claim 13, wherein the selector layer is formed by a pulsed laser deposition (PLD) process.

* * * * *